(12) United States Patent
Bunin et al.

(10) Patent No.: US 10,715,131 B2
(45) Date of Patent: Jul. 14, 2020

(54) SWITCHING POWER DEVICE

(71) Applicant: VISIC TECHNOLOGIES LTD., Nes Ziona (IL)

(72) Inventors: Gregory Bunin, Tel-Aviv (IL); David Shapiro, Rishon LeZion (IL)

(73) Assignee: Visic Technologies Ltd, Nes Ziona (IL)

( * ) Notice: Subject to any disclaimer, the term of this patent is extended or adjusted under 35 U.S.C. 154(b) by 0 days.

(21) Appl. No.: 15/574,502

(22) PCT Filed: Apr. 11, 2016

(86) PCT No.: PCT/IB2016/000457
§ 371 (c)(1),
(2) Date: Nov. 16, 2017

(87) PCT Pub. No.: WO2016/189371
PCT Pub. Date: Dec. 1, 2016

(65) Prior Publication Data
US 2018/0145674 A1 May 24, 2018

Related U.S. Application Data

(60) Provisional application No. 62/166,711, filed on May 27, 2015.

(51) Int. Cl.
*H03K 17/082* (2006.01)
*H03K 17/10* (2006.01)
(Continued)

(52) U.S. Cl.
CPC ..... *H03K 17/0822* (2013.01); *H03K 17/0828* (2013.01); *H03K 17/102* (2013.01);
(Continued)

(58) Field of Classification Search
CPC ............. H03K 17/0822; H03K 17/102; H03K 17/0828; H03K 17/567; H03K 17/6871;
(Continued)

(56) References Cited

U.S. PATENT DOCUMENTS 5,642,067 A * 6/1997 Grace ...................... H03K 4/94
327/130
9,350,342 B2 * 5/2016 Zojer ................... H03K 17/687
(Continued)

FOREIGN PATENT DOCUMENTS

EP  2 448 102  5/2012
EP  2 858 221  4/2015

OTHER PUBLICATIONS

International Search Report of Application No. PCT/IB2016/000457 dated Jul. 28, 2016.

*Primary Examiner* — Patrick C Chen
(74) *Attorney, Agent, or Firm* — A. C. Entis-IP Ltd; Allan C. Entis

(57) ABSTRACT

A switching power device (100) is provided which comprises: a normally-ON transistor (12), a normally-OFF metal-oxide-semiconductor field-effect transistor (MOSFET) (14), the normally-OFF MOSFET (14) being connected in series to a source terminal (12S) of the normally-ON transistor (12), and a driver (16) connected to and arranged to drive a gate terminal (12G) of the normally-ON transistor (12). A switching transistor (28) can then be positioned between the source terminal (12S) of the normally-ON transistor (12) and a common connection (30) of the driver (16) to protect the switching power device (100) from deleterious over-voltage and over-current spikes.

15 Claims, 7 Drawing Sheets

(51) Int. Cl.
  *H03K 17/567* (2006.01)
  *H03K 17/687* (2006.01)
  *H03K 17/693* (2006.01)
  *H03K 17/74* (2006.01)

(52) U.S. Cl.
  CPC ....... *H03K 17/567* (2013.01); *H03K 17/6871* (2013.01); *H03K 17/693* (2013.01); *H03K 17/74* (2013.01); *H01L 2224/49111* (2013.01); *H01L 2224/49175* (2013.01); *H01L 2924/19107* (2013.01); *H03K 2017/6875* (2013.01)

(58) Field of Classification Search
  CPC ........... H03K 17/6872; H03K 17/6874; H03K 17/74; H03K 17/693; H03K 2017/6875; H01L 2224/49111; H01L 2224/49175; H01L 2924/19107
  USPC ........................................................ 327/427
  See application file for complete search history.

(56) References Cited

U.S. PATENT DOCUMENTS

| | | | |
|---|---|---|---|
| 2009/0167411 A1* | 7/2009 | Machida | H01L 27/0605 327/427 |
| 2011/0102054 A1 | 5/2011 | Domes | |
| 2012/0087167 A1* | 4/2012 | Kuzumaki | H02M 7/5387 363/131 |
| 2014/0070786 A1* | 3/2014 | Guerra | G05F 1/618 323/285 |
| 2014/0091852 A1* | 4/2014 | Norling | H03K 17/102 327/409 |
| 2015/0048875 A1* | 2/2015 | Yang | H03K 3/356104 327/333 |
| 2018/0019743 A1* | 1/2018 | Hasegawa | H02M 3/337 |

\* cited by examiner

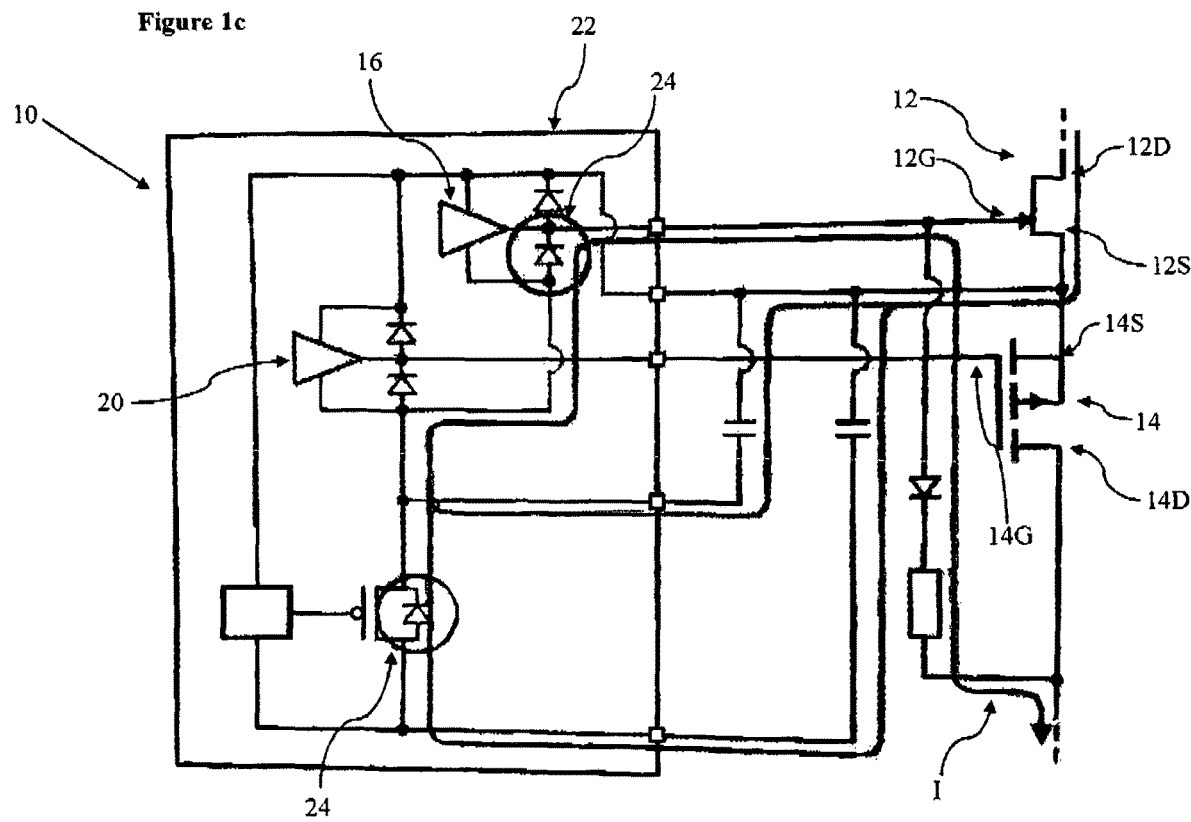

SWITCHING POWER DEVICE

CROSS-REFERENCE TO RELATED APPLICATIONS

This application is a National Phase Application of PCT International Application No. PCT/IB2016/000457, International Filing Date Apr. 11, 2016, entitled "Switching Power Device", published on Dec. 1, 2016 as International Patent Publication No. WO2016/189371, claiming the benefit of U.S. Provisional Patent Application No. 62/166,711, filed May 27, 2015, all of which are hereby incorporated by reference.

The present invention relates to a switching power device, in particular for use in control of consumer electronic products or systems.

Various products and systems, such as televisions, electric-powered vehicles, radar systems, electric motor controllers, and uninterrupted power supply systems, require the provision of a relatively large amount of electrical power, which is typically transmitted from a high voltage power supply. Various types of semiconductor field effect transistors (FETs) can be used as power switches to perform switching functions required by the products and/or systems.

Semiconductor FETS rely on silicon materials and technology. A typical FET would comprise a source terminal and a drain terminal which are for connecting a power source to a load. There is then a further terminal in the FET located between the source and drain terminals which is known as the gate terminal, and which controls the resistance of a current carrying channel in the FET located under the gate between the source and drain terminals. Voltage relative to a common ground voltage applied to the gate terminal generates an electric field in the FET which acts to control the resistance thereof, serving to turn the transistor ON or OFF.

When the FET is turned ON, the voltage applied to the gate terminal reduces the resistance in the channel so as to allow for relatively large current flow between the source and drain terminals. The total resistance between the source and drain terminals when the FET is turned ON can be referred to as the ON resistance of the transistor. The ON resistance depends upon the resistance of the channel, the resistance to the current flow of a region of the FET under and in the vicinity of the source terminal, and the resistance of a region of the FET under and in the vicinity of the drain terminal. The respective regions in and around the source and drain terminals are referred to as access regions of the FET.

Whereas conventional power FETs based on silicon (Si) provide useful switching functionality, they have reached the theoretical performance limit and cannot support further or higher switching frequencies and/or achieve system size reduction, together with enhanced efficiency. Such power switching applications may be useful, for instance, for the operation of devices such as electric motors and vehicles, fast chargers, uninterruptable power supplies and photovoltaic inverters. Switches suitable for operation of these devices are advantageously characterized by relatively high breakdown voltage when they are OFF, high ON current with low resistance between the drain arid source terminals (low Rds(on)), and relatively low gate and drain leakage currents. It is also advantageous that the switches be capable of operating at high junction temperatures and exhibit good tolerance to current and/or voltage transients that are liable to occur during switching from OFF and ON states of the switch. It is also preferable that such switches are OFF when their gate terminals are at ground potential.

For instance, it can be advantageous for a semiconductor power switch to have a breakdown voltage which is greater than or equal to around 600V and drain leakage currents of less than around 4 nA per mm of gate periphery when OFF. When the switch is ON, it is advantageous that the switch has an ON resistance less than or equal to 100 per mm of gate periphery and also be capable of safely supporting a drain current of greater than or equal to around 50 A.

Additionally, for safety reasons, it is generally advantageous that the switch be OFF for gate voltages of less than around 2V, and also that it is able to operate without becoming damaged for junction temperatures in excess of 175 degrees C. Silicon semiconductor switches are generally not configurable to provide these specifications, since the band gaps of semiconductor of such devices are typically less than around 1.5 eV, and saturation drift velocity of electrons in the materials and maximum electrical field do not naturally support high breakdown voltages and large ON currents.

On the other hand, nitride based semiconductors, such as Gallium Nitride (GaN) and Aluminium Nitride (AlN), are characterized by having relatively large band gaps. The band gaps are respectively 3.4 eV for GaN and 6.2 eV for Al. Furthermore, FETs which include a nitride semiconductor layer structure comprising a small band gap layer adjacent to a large band gap layer provide for a relatively high concentration of high mobility electrons which can be characterised as having a high saturation drift velocity. These high mobility electrons accumulate in a narrow triangular potential well at an interface between the layers to form a relatively thin, sheet-like electron concentration, referred to as a two-dimensional electron gas (2DEG). Due to the geometric construction and location of the 2DEG, electrons in the 2DEG generally exhibit very low donor impurity scattering, and as a result, the relatively high electron mobility and velocity, of the order of, for example, 1800 $cm^2/V*s$ and $1.5 \times 10^7$ cm/s respectively. Concentrations of electrons in a 2DEG may be as high as $1 \times 10^{13}/cm^2$. As a result of the above, transistors with a very low specific Rds(on) are feasible, that is, the resistance when the transistor is saturated.

FET transistors that operate by generating and controlling high mobility electrons in 2DEGs are conventionally referred to as high electron mobility transistors. Semiconductor layer structures comprising layers of different composition are referred to as having heterostructures, and interfaces between two adjacent layers of different composition are referred to as heterojunctions.

Whereas the inherent characteristics of nitride based semiconductor materials appear to make them excellent materials for use in producing high power semiconductor switches, it has proven difficult to exploit their desirable characteristics so as to provide such switches. For instance, 2DEG nitride FETs are normally-ON, whereas normally-OFF transistors are required for such switches. It has been difficult to produce nitride semiconductor layers having defect concentrations sufficiently low to produce power FETs having desired characteristics in a cost-effective manner and having proven reliability.

Recent GaN normally OFF transistors based on p-n junctions under the gate terminal suffer from low threshold voltage of typically less than 1.4V and high sensitivities to gate terminal over-voltage spikes. In addition, the turn-ON voltage of the gate terminal p-n junction diode is low and a current of tenths of mA may flow through the gate terminal, limiting the efficiency and reliability of the device.

One approach to providing a normally-OFF device 10 is by using a cascade connection of the normally-ON transistor 12, such as a GaN-based transistor, and a normally-OFF silicon low-voltage FET 14, typically a metal-oxide-semiconductor FET (MOSFET). Such a cascode circuit can be seen in FIG. 1a. There is provided the normally-ON GaN/AlGaN transistor 12, the source terminal 12S of which is connected to the drain terminal 14D of the normally-OFF MOSFET 14. A driver 16 and voltage supply 18 are also illustrated.

In a usable cascade configuration, such as that shown in FIG. 1a, the low-voltage silicon MOSFET 14 can be switched by its driver 20, which may be provided as part of a single driver chip 22, and the GaN transistor 12 can provide blocking functionality. However, there is a significant drawback to this approach in that there is an uncertainty in the potential between the source terminal 12S of the GaN transistor 12 and the source terminal 14S of the MOSFET 14. Voltage spikes above the permitted drain voltage range of low-voltage silicon transistors may appear, and as a result, the transistor and other components of the circuit may be damaged, in, for example, an arrangement as shown in FIG. 1b. Furthermore, in a standard cascade configuration, in order to handle large current of the order of tens of Amps, a specific silicon MOSFET must be used which has both large gate charge and capacitance, and this is typically unable to support efficient high frequency switching operations.

The addition of a parallel Zener diode to limit these spikes adds additional capacitances to be charged and discharged during each switching cycle, which in turn increases the switching losses of the switching power device. An ideal switching power device would switch between ON and OFF conditions instantly and with zero loss of power.

The present invention seeks to provide a means of limiting both the conduction and switching losses associated with a switching device of this type.

According to a first aspect of the invention, there is provided a switching power device comprising: a normally-ON transistor; a normally-OFF metal-oxide-semiconductor field-effect transistor (MOSFET), a source terminal or drain terminal of the normally-OFF MOSFET being connected in series to a source terminal of the normally-ON transistor; a driver connected to and arranged to drive a gate terminal of the normally-ON transistor; and a switching transistor positioned between the source terminal of the normally-ON transistor and a common connection of the driver.

By providing such an arrangement, it is possible to provide switching of a product of system with which the switching power device is associated in a safe and controlled manner. The provision of a normally-OFF MOSFET ensures that the switching power device is normally-OFF, with the normally-ON transistor providing the switching of ON-OFF of the device. The switching transistor then ensures safe operation of the switching power device during the associated product or system initial turn-on or final turn-off conditions, by cutting the path of the destructive current in the common connection of the driver.

Preferably, the normally-ON transistor may be formed as a high voltage GaN/AlGaN transistor. In which case, the normally-ON transistor may be formed from nitride-III elements having tertiary or quaternary hetero-structures, like $In_xGa_yAl_{1-y}N$ where $0 \leq x \leq 0.25$, $0 \leq y \leq 0.4$, where a two-dimensional electron gas may be formed mostly due to spontaneous polarization effects and less due to the piezoelectric effect, Such transistors are able to reduce the effect of Rds(on) increasing as a function of the junction temperature due to their low dependence on spontaneous polarization effects as a result of temperature changes.

Optionally, the normally-OFF transistor may be formed as a low voltage p-channel or n-channel Si MOSFET, and additionally or alternatively, the switching transistor may be formed as a p-channel or n-channel Si MOSFET.

The switching power device may further comprise any or all of: a diode which connects a drain terminal of the switching power device to a source terminal of the switching power device, which may be formed as an anti-parallel Schottky diode; a further diode which connects the gate terminal of the normally-ON transistor to the source terminal of the switching power device; a MOSFET body diode connected from the drain terminal to the source terminal of the normally-OFF MOSFET; and a switching-transistor body diode connected from a source terminal to a drain terminal of the switching transistor.

The provision of the diodes ensures and improves the safe operation area working conditions of the switching power device during turn-ON and turn-OFF conditions.

Preferably, there may be further provided a further driver connected to and arranged to drive a gate terminal of the normally-OFF MOSFET, and furthermore, there may be provided a logic sequencer associated with at least the driver for controlling the switching power device. Optionally, the switching power device may have an Rds(on) of less than 150 mΩ, a blocking voltage greater than 400V, and a continuous current greater than 15 A.

According to a second aspect of the invention there is provided a method of protecting the components of a switching power device from the effects of over-current spikes, the method comprising the steps of providing a switching power device, preferably in accordance with the first aspect of the invention, the switching transistor cutting a path from the source terminal of the normally-ON transistor to the common connection (30) of the driver in the event of an over-current spike.

The invention will now be more particularly described, by way of example only, with reference to the accompanying drawings, in which:

FIG. 1c shows a circuit diagram of a power switching device having no additional switching transistor, indicating a path of undesirable high current through the circuit;

FIG. 2b shows a magnified view of the bounded region in FIG. 2a;

Figure 4A:
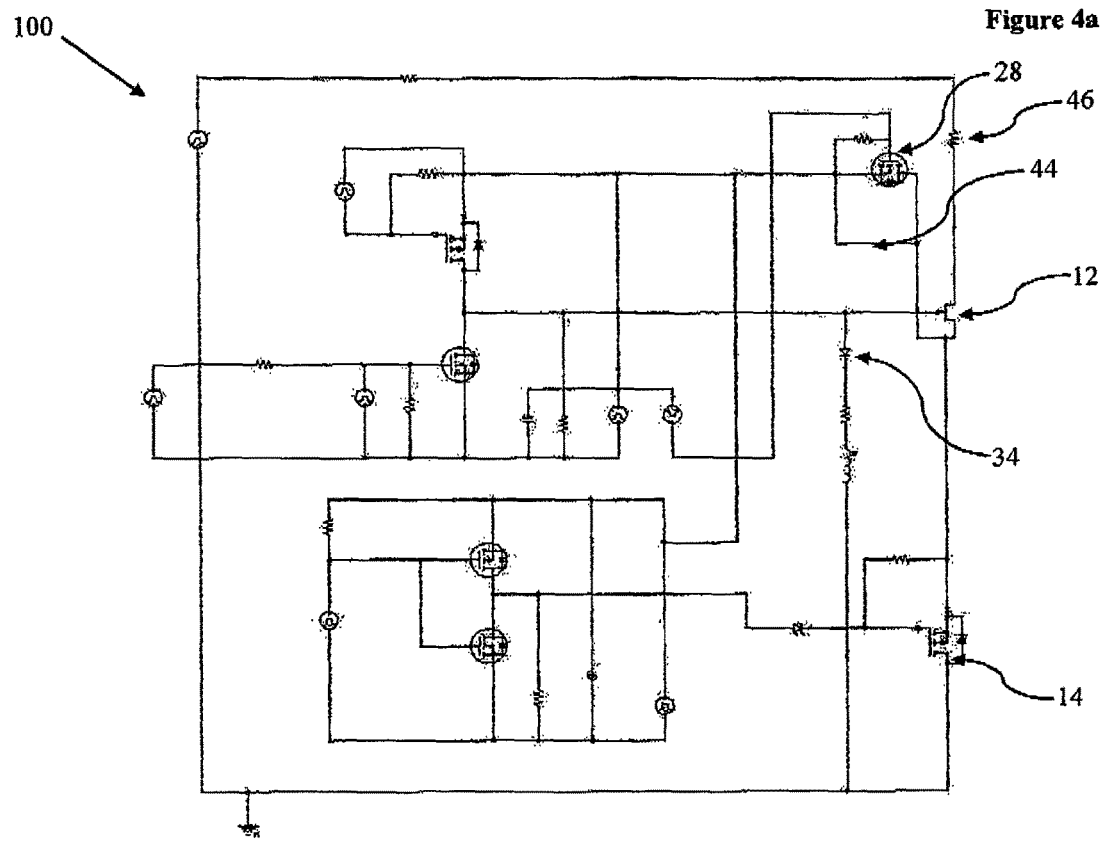
FIG. 4a shows a circuit diagram of a third embodiment of a switching power device in accordance with the first aspect of the invention, the switching transistor being shorted.
Figure 4B:
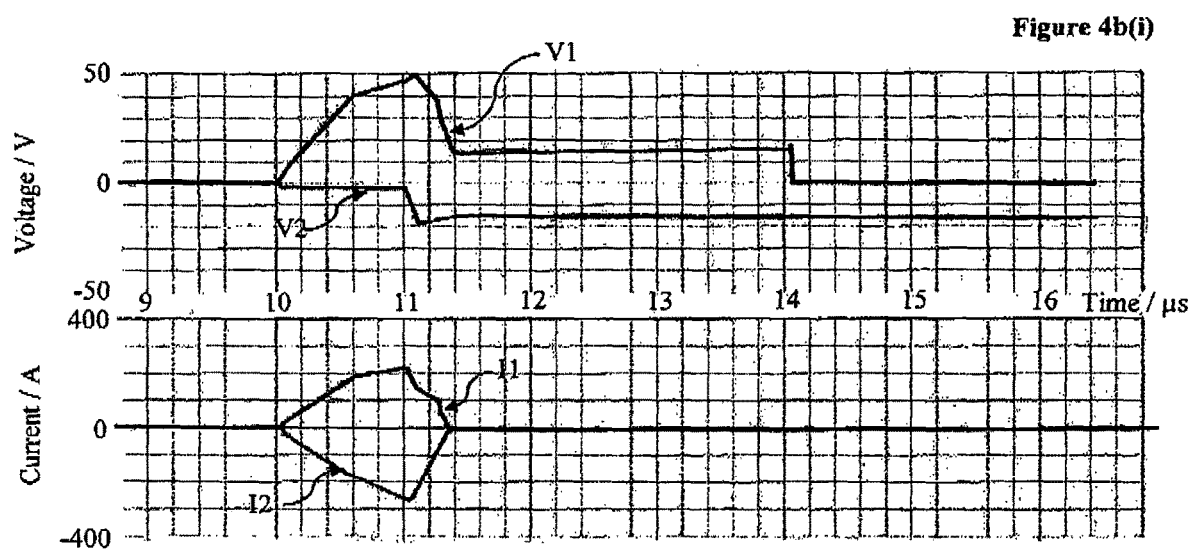
Figure 5A:
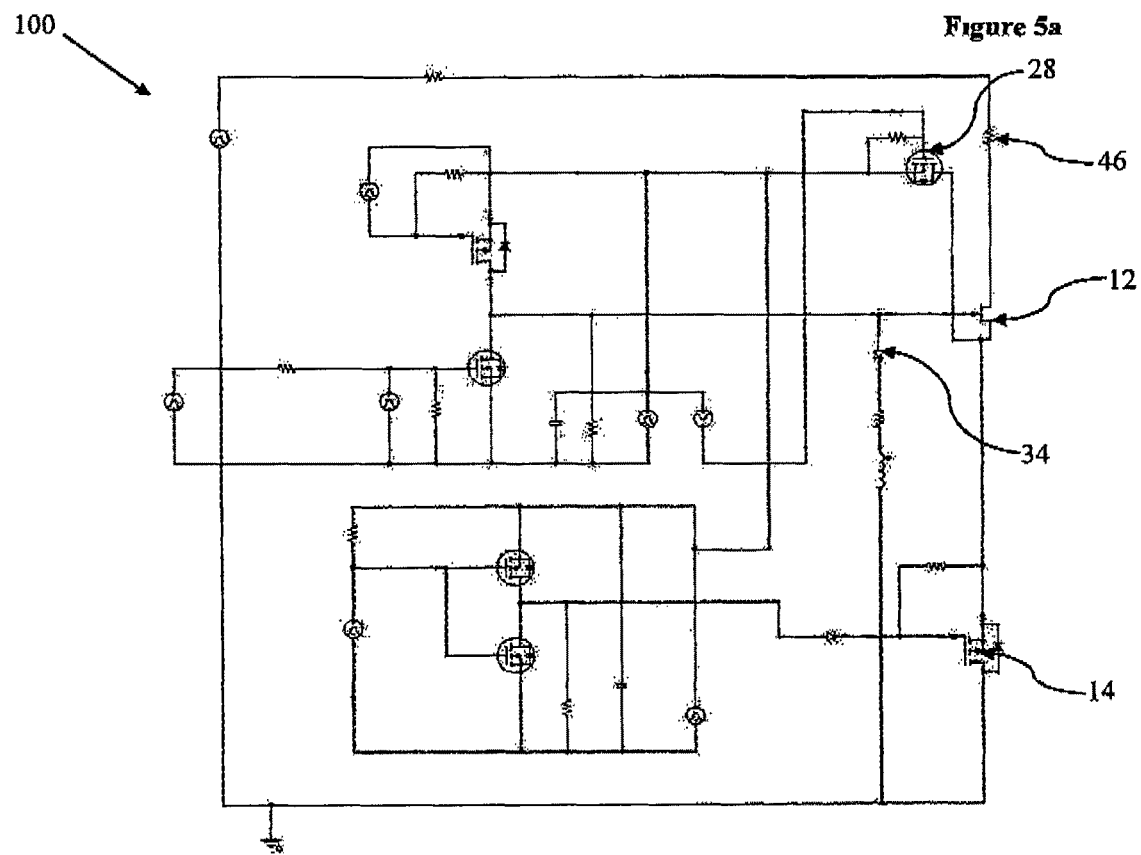
Figure 5B:
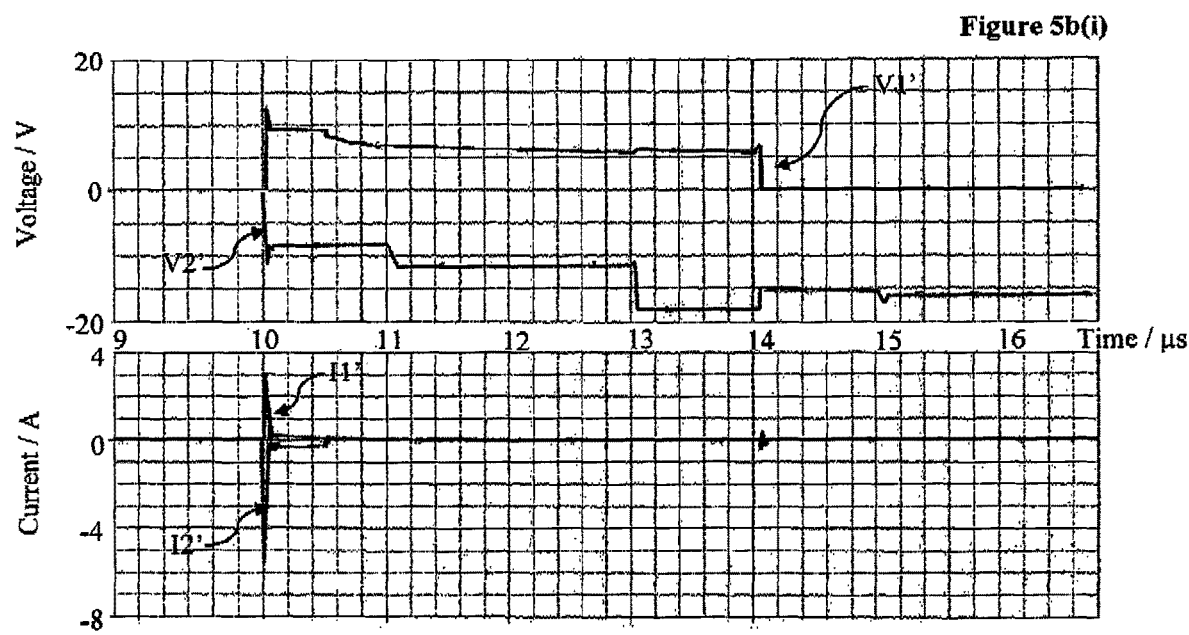

FIGS. 4b(i) and 4b(ii) respectively show simulated plots of over-voltage and over-current versus switching time of the switching power device of FIG. 4a;

FIG. 5a shows a circuit diagram of the third embodiment of the switching power device, with the bypass wire having been removed from the switching transistor; and FIGS. 5b(i) and 5b(ii) respectively show simulated plots of the voltage and current versus switching time of the switching power device of FIG. 5a.

Figure 1A:
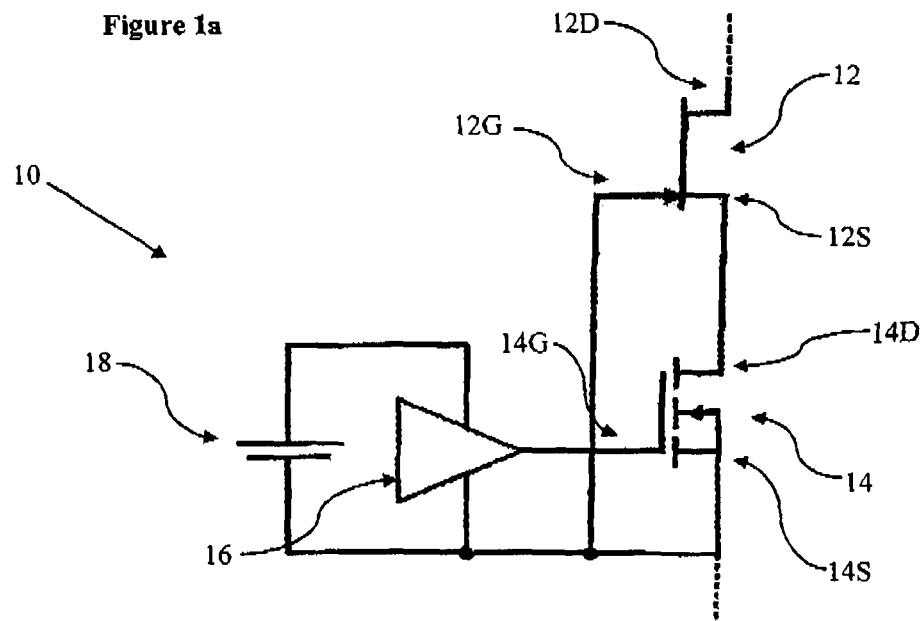
FIG. 1a shows a circuit diagram of a classic cascode circuit, in accordance with the state of the art.
Figure 1B:
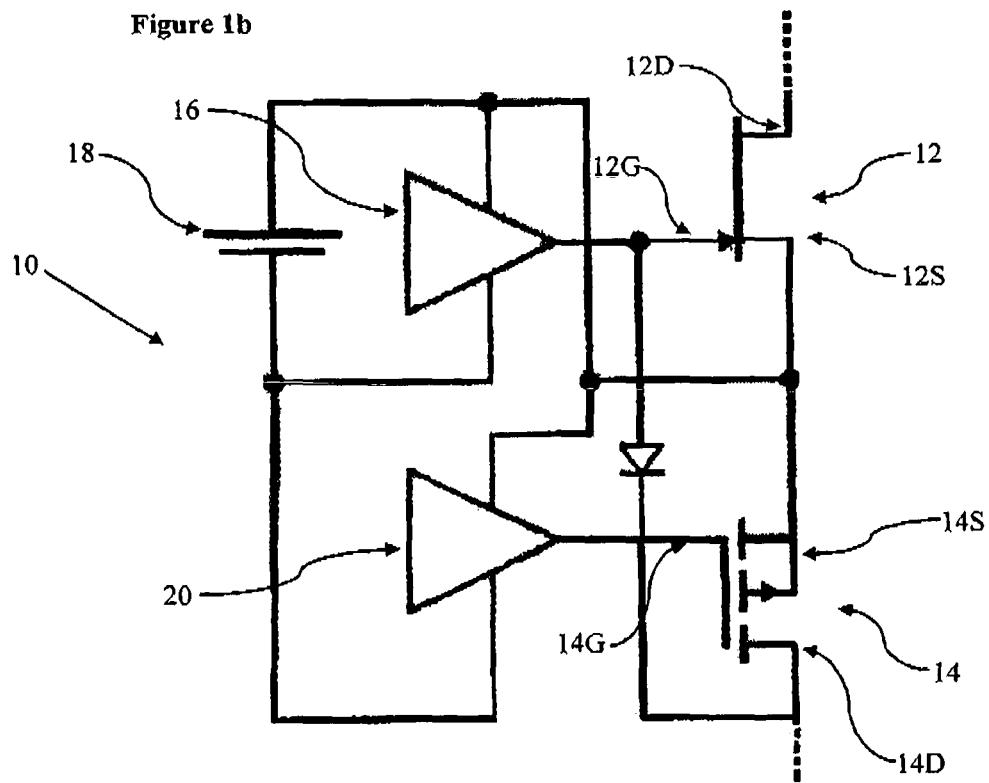
FIG. 1b shows a portion of a circuit diagram of a serial connection between a high voltage normally-ON transistor and a silicon low-voltage normally-OFF transistor, in accordance with the state of the art.
Figure 2A:
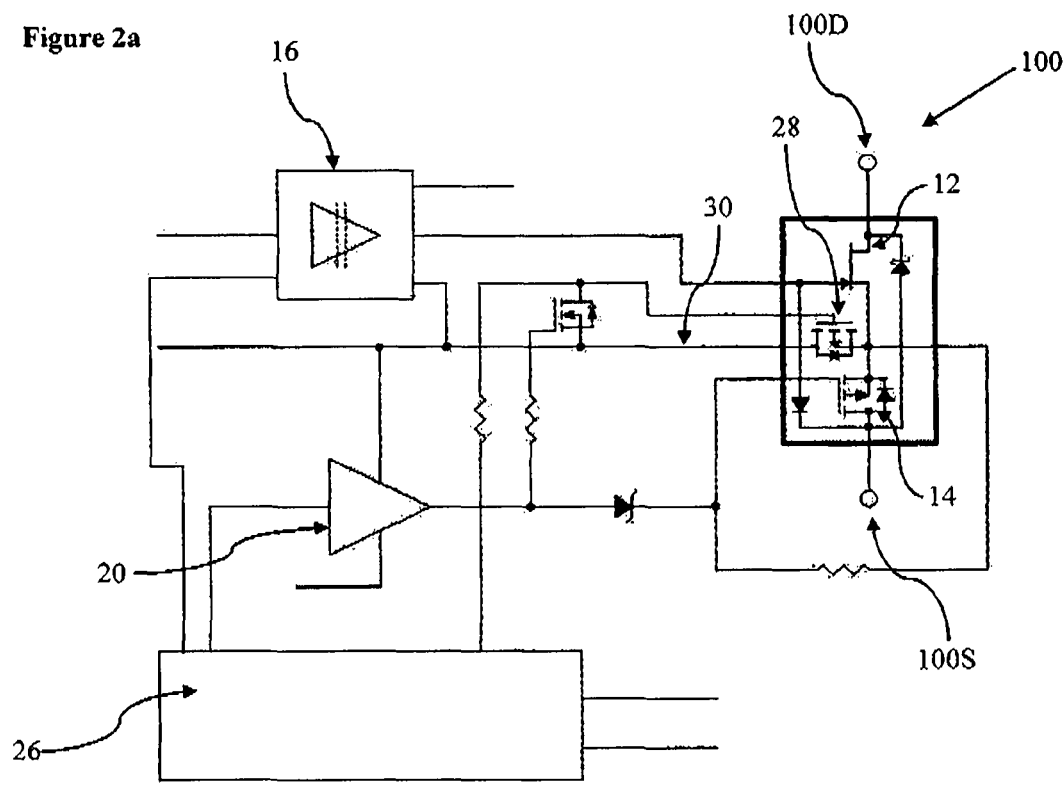
FIG. 2a shows a circuit diagram of a first embodiment of a switching power device in accordance with the first aspect of the invention.
Figure 2B:
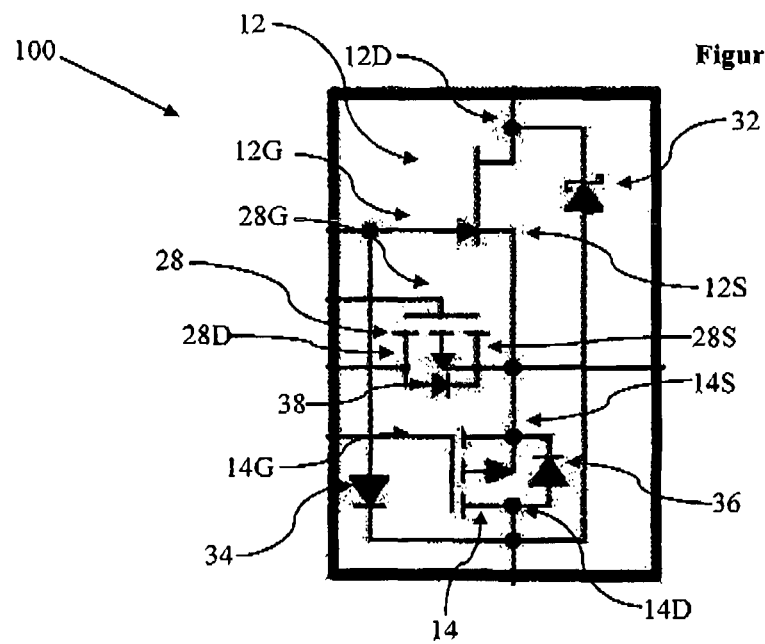
Figure 3:
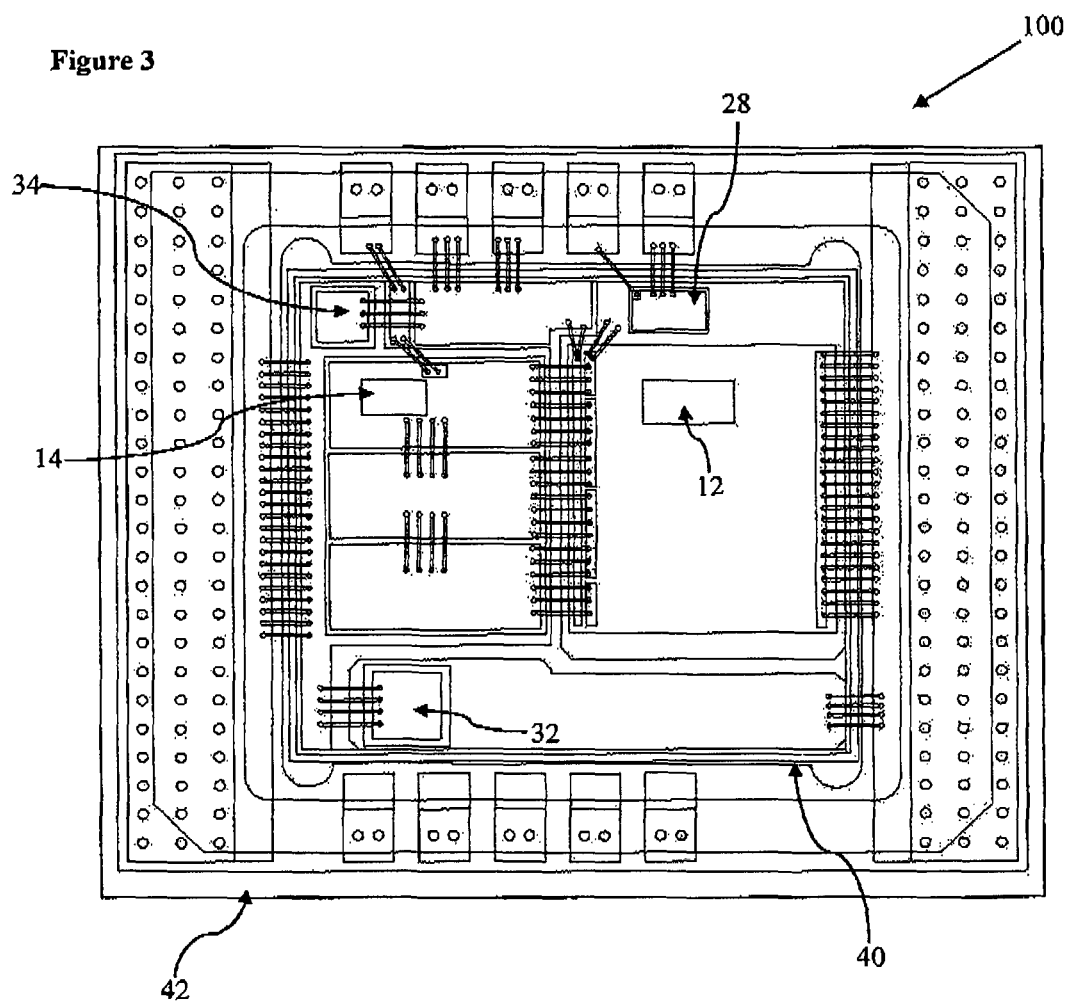
FIG. 3 shows a plan view of an assembly of the switching power device of FIG. 2a on an isolated substrate.

With reference to FIG. 1c, a flow of undesirable current I through a circuit of a switching power device 10 in the event of incorrect turn-on of the device 10 can be seen, which can result in damage to or destruction of the circled components 24. Referring to FIGS. 2a, 2b and 3, there is shown a switching power device indicated globally at 100. Where similar or identical components to those previously described in relation to prior art switching power devices 10 are described, they will be referred to using corresponding reference numerals for simplicity.

The switching power device 100 includes a normally-ON transistor 12, such as the normally-ON high-voltage GaN/AlGaN transistor depicted, though other normally-ON transistors could be considered. For example, it may be possible to utilise transistors formed from a range of nitride-III elements or compounds having tertiary or quaternary heterostructures, such as $In_x Al_y Ga_{1-y}N$ alloys. The source terminal 12S of the normally-ON transistor 12 is serially connected to the source terminal 14S of a normally-OFF MOSFET 14, preferably a low-voltage p-channel silicon MOSFET as depicted. A gate terminal 12G of the normally-ON transistor 12 is connected to a driver 16, and there may further be provided a separate driver 20 which is connected to the gate terminal 14G of the normally-OFF MOSFET 14. The or each driver 16, 20 may be provided as part of a single driver chip 22, and may be provided so as to be associated with a logic sequencer 26 arranged to control the switching of the switching power device 100.

There is then provided a switching transistor 28, which in the depicted embodiment is formed as a further low-voltage switching element, here as a p-channel silicon MOSFET, which is connected between a common connection 30 of the driver 16 to the normally-ON transistor 12 and the source terminal 12S of the normally-ON transistor 12. In particular, the connection is to the source-source point of the serially connected normally-ON transistor 12 and normally-OFF transistor 14.

There may additionally be provided a diode 32 which connects a source terminal 100S of the switching power device 100 to a drain terminal 100D of the switching power device 100, which may be provided as a Schottky diode, preferably formed from silicon carbide (SiC), arranged so as to be anti-parallel to the drain to source 100D, 100S of the switching power device 100.

Furthermore, there may be a further diode 34 provided which connects the gate terminal 12G of the normally-ON transistor 12 to the source terminal 100S of the switching power device 100, a MOSFET body diode 36 connected from the drain terminal 140 to the source terminal 14S of the normally-OFF MOSFET 14, and/or a switching-transistor body diode 38 connected from a source terminal 28S to a drain terminal 28D of the switching transistor 28. Any or all of these diodes 32, 34, 36, 38 can be provided so as to improve the safe operating conditions of the switching power device 100, since the current flow through the circuit will be controlled.

Figure 2C:
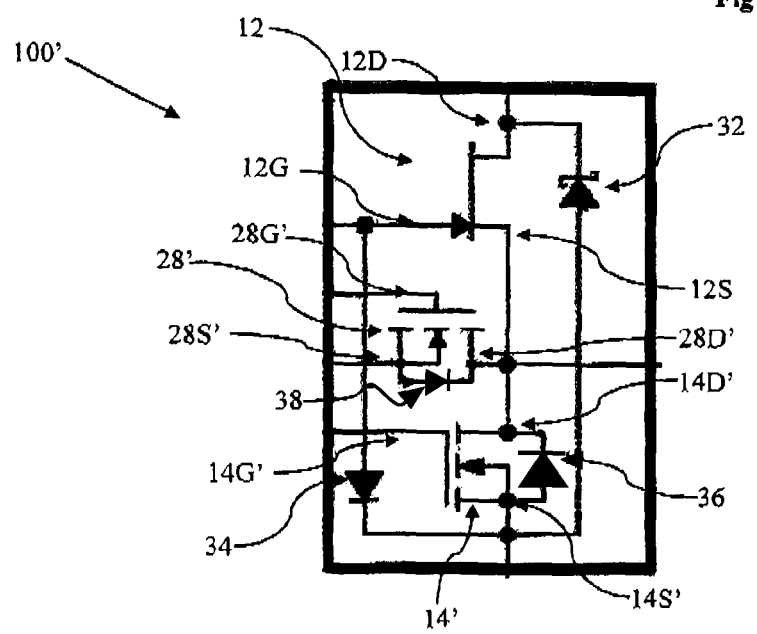
FIG. 2c shows a circuit diagram of a second embodiment of a switching power device in accordance with the first aspect of the invention.

An alternative embodiment of switching power device 100' is illustrated in FIG. 2c. This embodiment of the invention is substantially identical to that shown in FIGS. 2a and 2b; however, instead of a p-channel normally-OFF MOSFET and a p-channel MOSFET switching transistor, an n-channel normally OFF MOSFET 14' and an n-channel MOSFET switching transistor 28' are provided, respectively having source terminals 14S', 28S', drain terminals 14D', 28D' and gate terminals 14G', 28G'. Operationally, the switching power device 100' functions in much the same way as the previously described switching power device 100.

A switching power device 100 is shown in situ in FIG. 3. It may be that such a device 100 utilises components which are assembled by soldering, sintering or gluing using conductive adhesive on a highly isolated substrate 40 made from a substance having high thermal conductivity, such as a ceramic material. Such a material may be provided so as to have metallic or otherwise conductive traces which define a connection between the components, for example, using aluminium, copper or gold wire bonds.

All components and isolated substrates 40 may then be, as illustrated, assembled into the cavity of a leadless package or module 42. Optionally, the module 42 may be of the surface-mounted type, or the module 42 may have short or shortened leads which can work as springs during thermal cycling so as to increase the mechanical robustness of the switching power device 100 under harsh operational conditions.

It is desirable for the power switching device 100 to have low parasitic inductance interconnections of the components in order to enable fast, low-loss switching. In an embodiment of the power switching device 100, the relevant components may be interconnected by wire bonding onto said components and the isolated substrate 40 with good thermal conductivity. The substrate 40 may be attached to a heat sink element of the module 42 by any thermal compound or solder.

An external controller may also be provided which is capable of supplying the correct turn-ON and turn-OFF timing and logic sequences to the switching power device 100. This may be optionally placed within the cavity of the module 42. An external sequencer may be provided so as to act as a comparator, which is able to hold the gate 28G of the switching transistor 28 at safety conditions, until such a time as the supplied voltage to the drivers 16, 20 becomes stable and greater than a predetermined level. This may enable signal for pulse-width modulation of the switching power device 100. Furthermore, such an external sequencer may be able to connect the common connection 30 of the driver 16 of the normally-ON transistor 12 via the drain and source terminals 28D, 28S of the switching transistor 28.

Overall, this can produce a switching power device 100 which has an Rds(on) of less than 150 mΩ, a blocking voltage greater than 400V, and a continuous current greater than 15 A, for example.

In use, switching is performed by the normally-ON transistor 12 using its, preferably isolated, driver 16, whilst the normally-OFF MOSFET 14 is turned on at all times except during abnormal conditions such as loss of driving signal and during turn-ON and turn-OFF of the power switching device 100.

Ordinarily, in the event of the turn-ON of a power switching device with incorrect timing, large undesirable over-current and over-voltage spikes can occur. This can be visualised from the circuit diagram of FIG. 4a, in which the switching transistor 28 has been shorted with a shorting connection 44, and in the plots of voltage and current versus switching time shown in FIGS. 4b(i) and 4b(ii).

In FIG. 4b(i), the upper line V1 indicates the potential difference between the gate terminal 12G and the source terminal 12S of the normally-ON transistor, whereas the lower line V2 indicates the instant voltage at the source terminal 14S of the normally-OFF MOSFET 14. In FIG. 4b(ii), the upper line I1 indicates the current measured across the resistor indicated at 46 in FIG. 4a, whereas the lower line I2 indicates the current measured at the further diode 34 which connects the gate terminal 12G of the normally-ON transistor 12 to the drain terminal 14D of the normally-OFF MOSFET 14. As can be seen, deleterious current reaching upwards of 200 A can be measured across the respective components, which will likely result in damage thereof.

This can be contrasted with the circuit diagram shown in FIG. 5a, in which there is no shorting connection bypassing the switching transistor 28. The switching transistor 28 cuts the path of the destructive current in the common connection 30 to the source terminal 12S of the normally-ON transistor 12 to its driver 16, and the corresponding voltages and currents can be viewed in FIGS. 5b(i) and 5b(ii).

On the upper line V1' in FIG. 5b(i), the potential difference between the gate terminal 12G and the source terminal 12S of the normally-ON transistor 12 can be seen, and at its peak, this is approximately five times less than for the situation as shown in FIG. 4b(i). The voltage at the source terminal 14S of the normally-OFF MOSFET 14, as indicated by the lower line V2', is largely the same as for the previous case.

However, for the current analogue, the deleterious current flow through the switching power device 100 has been stemmed. As can be seen, at both resistor 46 and further diode 34, there is a small current spike on switching which is limited to approximately 4 A, as can be seen from the upper and lower lines I1', I2' respectively. However, this is merely a transient current, and the danger of damage to the component parts is negligible.

The logic sequencer 26 provides the correct timing for all components. Upon system turn-ON, the switching transistor 28 blocks the undesirable current. After a predetermined time when all transient turn-ON spikes will have passed, the sequencer 26 can turn on the switching transistor 28 so as to short the connection from the source terminal 12S of the normally-ON transistor 12 to the common connection 30 to its driver. After a short delay, the sequencer permits the insertion of pulse-width modulation signals used for switching the device.

It is therefore possible to provide a switching power device which is capable of reducing or eliminating the effects of deleterious over-current on the component parts by the use of a switching transistor. This allows for the combination of a serially-connected normally-ON transistor and a normally-OFF MOSFET to be utilised without the need for a Zener diode or similar device, improving the efficiency of the power switching device significantly.

The words 'comprises/comprising' and the words 'having/including' when used herein with reference to the present invention are used to specify the presence of stated features, integers, steps or components, but do not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of examples only, and various other modifications will be apparent to persons skilled in the field without departing from the scope of the invention as defined herein.

The invention claimed is:

1. A switching power device (100) comprising:
    a normally-ON transistor (12) having a source terminal (12S) and a gate terminal (12G);
    a normally-OFF transistor (14) having a source terminal (14S) or drain terminal (14D) connected in series to the source terminal (12S) of the normally-ON transistor (12);
    a driver (16) connected to the gate terminal (12G) of the normally-ON transistor (12) and arranged to drive the gate terminal (12G) of the normally-ON transistor (12) to perform switching of the normally-ON transistor (12);
    a switching transistor (28) connected between the source terminal (12S) of the normally-ON transistor (12) and a common connection (30) of the driver (16);
    a sequencer (26);
        wherein the switching transistor (28) is turned off upon system turn on; and
        wherein the sequencer (26) is configured to, after a predetermined time from system turn on:
    turn on the switching transistor (28) so as to connect the source terminal (12S) of the normally-ON transistor (12) to the common connection (30) of the driver (16);
    turn on the normally-OFF transistor (14) so as to connect the source terminal (12S) of the normally-ON transistor (12) to the drain or source terminal respectively of the normally-OFF transistor; and
    permit insertion of pulse-width modulation signals for switching the switching power device.

2. A switching power device (100) as claimed in claim 1, wherein the normally-ON transistor (12) is formed as a high voltage GaN/AlGaN transistor.

3. A switching power device (100) as claimed in claim 1, wherein the normally-ON transistor (12) is formed from nitride-III elements having tertiary or quaternary heterostructures.

4. A Switching power device (100) as claimed in claim 1, wherein the normally-OFF transistor (14) is formed as a low voltage p-channel or n-channel Si MOSFET.

5. A switching power device (100) as claimed in claim 1, wherein the switching transistor (28) is formed as a p-channel or n-channel Si MOSFET.

6. A switching power device (100) as claimed in claim 1, further comprising a diode (32) which connects a drain terminal (100D) of the switching power device (100) to a source terminal (100S) of the switching power device (100).

7. A switching power device (100) as claimed in claim 6, wherein the diode (32) is formed as an anti-parallel Schottky diode.

8. A switching power device (100) as claimed in claim 1, further comprising a further diode (34) which connects the gate terminal (12G) of the normally-ON transistor (12) to a source terminal (100S) of the switching power device (100).

9. A switching power device (100) as claimed in claim 1, further comprising a MOSFET body diode (36) connected from the drain terminal (14D) to the source terminal (14S) of the normally-OFF transistor (14).

10. A switching power device (100) as claimed in claim 1, further comprising a switching-transistor body diode (38) connected from a source terminal (28S) to a drain terminal (28D) of the switching transistor (28).

11. A switching power device (100) as claimed in claim 1, further comprising a further driver (20) connected to and arranged to drive a gate terminal (14G) of the normally-OFF transistor (14).

12. A switching power device (100) as claimed in claim 1, further comprising a logic sequencer (26) for controlling the switching power device (100).

13. A switching power device (100) as claimed in claim 1, wherein the device (100) has an Rds(on) of less than 150 mΩ, a blocking voltage greater than 400V, and a continuous current greater than 15A.

14. A method of protecting the components of a switching power device (100) from the effects of over-current spikes, the method comprising the steps of providing a switching power device (100) as claimed in claim 1, the switching transistor (28) cutting a path from the source terminal (12S) of the normally-ON transistor (12) to the common connection (30) of the driver (16) to avoid over-current spike.

15. A switching power device (100) as claimed in claim 1, wherein the normally-OFF transistor (14) is metal-oxide-semiconductor field-effect transistor (MOSFET).

\* \* \* \* \*